United States Patent
Kurosaka et al.

[11] Patent Number: 6,099,642
[45] Date of Patent: Aug. 8, 2000

[54] APPARATUS FOR PULLING UP SINGLE CRYSTALS AND SINGLE CRYSTAL CLAMPING DEVICE

[75] Inventors: Shoei Kurosaka; Hiroshi Inagaki; Shigeki Kawashima; Junsuke Tomioka, all of Kanagawa, Japan

[73] Assignee: Komatsu Electronic Metals Co., Ltd., Kanagawa, Japan

[21] Appl. No.: 09/088,657

[22] Filed: Jun. 2, 1998

[30] Foreign Application Priority Data

Jun. 2, 1997 [JP] Japan .................................. 9-159210

[51] Int. Cl.$^7$ .................................................. C30B 35/00
[52] U.S. Cl. .............................. 117/218; 117/14; 117/201; 117/202; 117/218; 117/911
[58] Field of Search .................... 117/13, 14, 15, 117/201, 202, 208, 911

[56] References Cited

U.S. PATENT DOCUMENTS

| | | | |
|---|---|---|---|
| 5,725,660 | 3/1998 | Hiraishi et al. | 117/201 |
| 5,824,153 | 10/1998 | Suda | 117/208 |
| 5,858,088 | 1/1999 | Hiraishi et al. | 117/218 |
| 5,879,448 | 3/1999 | Urano et al. | 117/13 |
| 5,879,451 | 3/1999 | Mizuishi | 117/208 |
| 5,882,397 | 3/1999 | Iino et al. | 117/13 |

*Primary Examiner*—Felisa C. Hiteshew
*Attorney, Agent, or Firm*—Sughrue, Mion, Zinn, Macpeak & Seas, PLLC

[57] ABSTRACT

An object of the invention is to provide a single crystal clamping device and a single crystal supporting method. The single crystal clamping device does not become inclined and does not vibrate, and the center of the single crystal clamping device is congruous to the center of the growing single crystal. An apparatus for pulling up single crystals of the present invention, comprises: a single crystal pulling up wire for pulling up a seed crystal immersed in a melt of a raw material; a single crystal clamping device for clamping one end of the single crystal grown beneath the seed crystal; a wire-winding mechanism fixed on the single crystal clamping means and winding up the single crystal pulling up wire so as to adjust a speed of the single-crystal pulling up wire corresponding to the ascending/descending speeds of the single crystal clamping device; a pulling up wire-load cell for detecting the load applied on the crystal; and a summation load cell for measuring the combined load applied on the crystal pulling up wire and the single crystal clamping device.

13 Claims, 6 Drawing Sheets

APPARATUS FOR PULLING UP SINGLE CRYSTALS AND SINGLE CRYSTAL CLAMPING DEVICE

BACKGROUND OF THE INVENTION

1. Field of the Invention

This invention relates to an apparatus and a method for pulling up single crystals and a single crystal clamping device used for the same, which device is installed in equipment used for fabricating single crystals by the CZ method. This invention especially relates to an apparatus suitable for fabricating heavy single-crystal bodies.

2. Description of the Related Art

Single crystals are conventionally fabricated by the CZ method. In the CZ method, polycrystalline silicon lumps are fed into a quartz crucible of a single-crystal fabricating device, then the quartz crucible is heated by heaters disposed therearound to melt the polycrystalline silicon lumps, thereafter a seed crystal installed on a seed chuck is dipped into the melt. After that, the seed chuck and the quartz crucible are respectively driven to rotate in opposite or identical directions, and at the same time the seed chuck is pulled up to grow a single-crystal silicon ingot of predetermined diameter and length.

In the seed crystal, a dislocation will arise due to the heat shock occurring at the time of dipping it into the melt. In order to stop the propagation of a dislocation from the seed crystal to the single crystal to be grown, a dash-neck method is used. According to the dash-neck method, a reduced portion with a diameter of several mm is grown up beneath the seed crystal so as to release the dislocation to the surface of the reduced portion. After making certain that the propagation of dislocation has been stopped, a shoulder is formed and the single crystal is enlarged to comply with a predetermined diameter. Then, the pulling up operation is shifted from the enlarging step to forming the straight body (hereinafter referred to as "body") of the single crystal.

In recent years, following the enlargement of single crystals, the weight of an individual single crystal is increasing, and the strength extent of the reduced portion is reaching its limit. Therefore, in conventional processes for pulling up crystals, there exists a danger of breaking the necked portion, and single crystals could not be safely pulled up. To solve the problem, measures are taken to clamp a single crystal by engaging a clamping member at a reduced portion that is formed after the propagation of dislocation has been stopped by the reduction process in the dash-neck method. Due to the fact the most of the weight of the single crystal is held by the clamping member, breaking of the reduced portion can be prevented. Even if the reduced portion breaks, dropping of the single crystal can also be avoided.

However, when the single crystal clamping device is suspended by a plurality of wires and the wires are wound up by driving a winding drum, it is difficult to precisely control the wound-up length of each winding up drum. Accordingly, the single crystal clamping device becomes inclined, and the weight of the single crystal can not be equally loaded between the wires.

Furthermore, this deviation induces the eccentric rotation of the single crystal clamping device and causes the vibration of the clamping device, and thus dislocates the growing single crystal held therein. Furthermore, as the single crystal clamping device is suspended from the top end of the single crystal fabricating apparatus by wires, the center of the single crystal clamping device is not congruous with the center of the growing single crystals. Accordingly, the clamping can not be firmly achieved.

SUMMARY OF THE INVENTION

In view of the above mentioned problems in the prior art, an object of the invention is to provide a single crystal pulling up device and a single crystal pulling up method in which, upon clamping of a single crystal or after clamping the single crystal, the single crystal clamping device does not become inclined and does not vibrate, and in which the center of the single crystal clamping device is congruous to the center of the growing single crystal.

In order to attain the above object, the single crystal clamping device of the invention includes a crystal pulling up wire for pulling up the seed crystal immersed in the melt of the raw material, a single crystal clamping device for clamping one end of the single crystal grown surrounding the seed crystal, and a wire-winding mechanism fixed on the single crystal clamping device for raising and lowering the crystal by winding up the crystal pulling up wire, and is characterized in that the raising and lowering of the single crystal clamping device and the winding up of the wire-winding mechanism are controlled independently and the pulling up apparatus further comprises pulling up wire-load cell for detecting the load applied on the crystal and a summation load cell for measuring the combined load applied on the crystal pulling up wire and the single crystal clamping device.

Namely a first aspect of the apparatus is an apparatus for pulling up single crystals of the present invention, which comprises:

a single crystal pulling up wire for pulling up a seed crystal immersed in a melt of a raw material;

a single crystal clamping device for clamping one end of the single crystal grown beneath the seed crystal;

a wire-winding mechanism fixed on the single crystal clamping means and winding up the single crystal pulling up wire so as to adjust a speed of the single-crystal pulling up wire corresponding to the ascending/descending speeds of the single crystal clamping device;

a pulling up wire-load cell for detecting the load applied on the crystal; and a summation load cell for measuring the combined load applied on the crystal pulling up wire and the single crystal clamping device.

According to the above structure, as the single crystal clamping device and the wire-winding mechanism are integrally fixed, no vibration or inclination is caused, and thus upon clamping of the single crystal or after clamping the single crystal, the dislocation of the single crystal can be prevented. Furthermore, as the raising or lowering of the single crystal clamping device when clamping the single crystal is based on the speed of the winding up of the wire-winding mechanism, the impact of the difference of the ascending speed of the crystal pulling up wire and the single crystal clamping device is avoided.

Furthermore, as the single crystal clamping device and the wire-winding mechanism constitute an integral rotating mechanism, friction caused by the difference of the rotation speed is not generated.

A second aspect of the apparatus is an apparatus according to the first aspect, which further comprises:

a controlling device for controlling the winding up speed of the wire-winding mechanism and the ascending/descending speed of the pulling up mechanism, so as to adjust a ratio between the load applied on the crystal pulling up wire and the load applied on the single crystal clamping device so as not to break the single crystal, by monitoring the pulling up wire-load cell and the summation load cell.

According to the above construction, the load applied on the neck portion is monitored by the load cell of the pulling up wire, while the load applied on the single crystal clamping device can be monitored by the difference between the value of the load cell of the total load and the value of the load cell of the pulling up wire.

Furthermore, the actual pulling up speed after the single crystal is held by the single crystal clamping device can be adjusted to be the same as the pulling up speed when using only the crystal pulling up wire.

When pulling the single crystal, the controlling device distributes the weight of the single crystal between the crystal pulling up wire and the single crystal clamping device at a predetermined ratio, this distribution based on the values of the load cells.

A third aspect of the apparatus is an apparatus according to the first aspect, wherein said single crystal clamping device is fixed at the bottom end of a shaft which is mounted at the bottom end of the wire-winding mechanism, having a hole, and said shaft, the pulling up wire-winding mechanism and the single crystal clamping device are carried on a carriage ascending/descending along the shaft.

According to the above structure, the single crystal clamping device is integrally mounted with the wire-winding mechanism for the crystal pulling up wire by means of the shaft and is raised or lowered by the carriage. Thus, no vibration or inclination occurs as when the single crystal clamping device is suspended from a wire. Furthermore, with respect to the crystal pulling up wire, the center of the single crystal clamping device does not move.

A fourth aspect of the apparatus is an apparatus according to the third aspect, wherein said single crystal clamping device comprises:

a body having a hole at the center thereof;

a plurality of hollowed out grooves formed at the periphery of the hole; and vertically movable clamping rods disposed in said plurality of grooves for clamping the reduced portion formed in the top end of the single crystal being pulled up.

According to the above structure, the reduced portion of the single crystal is held by a clamping rod in a hollowed out groove mounted on the single crystal clamping device.

A fifth aspect of the apparatus is an apparatus according to the fourth aspect, wherein said clamping rod is in a shape of a drum whose two end portions are larger than the center portion and the center portion is constricted.

When the clamping rod is in the shape of a drum, each one of the clamping rods is in contact with two points on the cone surface forming the reduced portion of the single crystal. Compared to one point contact, this manner of clamping is stable and the stress generated at the points of contact is reduced.

Furthermore, the clamping device and the clamping rod of the single crystal clamping device are characterized by being made of refractory metal such as molybdenum or carbon fiber reinforced carbon.

Namely a sixth aspect of the apparatus is an apparatus according to the fourth aspect, wherein said single crystal clamping device is made of refractory metal.

A seventh aspect of the apparatus is an apparatus according to the sixth aspect, wherein said single crystal clamping device is made of molybdenum.

An eighth aspect of the apparatus is an apparatus according to the fourth aspect, wherein said single crystal clamping device is made of carbon fiber reinforced carbon.

According to the above structure, although the clamping device and the clamping rods of the single crystal clamping device are lowered to the vicinity of the surface of the melt, they are not easily broken, deformed or degraded due to the above structure, and thus can support a predetermined weight.

A ninth aspect of the apparatus is an apparatus according to the first aspect, further comprising:

a diameter controlling device for controlling the winding up speed of the wire-winding mechanism and the ascending/descending speed of the pulling up mechanism, so as to control a diameter of the single crystal being pulled up by monitoring the pulling up wire-load cell and the summation load cell and calculating a weight of the single crystal being pulled up.

A tenth aspect of the device is a single crystal clamping device of the present invention, which comprises:

a body having a hole at the center thereof;

a plurality of hollowed out grooves formed at the periphery of the hole; and vertically movable clamping rods disposed in said plurality of grooves for clamping the reduced portion formed in the top end of the single crystal being pulled up.

An eleventh aspect of the apparatus is an apparatus according to the tenth aspect, wherein said clamping rod is in a shape of a drum whose two end portions are larger than the center portion and the center portion is constricted.

A twelfth aspect of the apparatus is an apparatus according to the eleventh aspect, wherein said single crystal clamping device is made of refractory metal.

A thirteenth aspect of the apparatus is an apparatus according to the twelfth aspect, wherein said single crystal clamping device is made of molybdenum.

A fourteenth aspect of the apparatus is an apparatus according to the eleventh aspect, wherein said single crystal clamping device is made of carbon fiber reinforced carbon.

According to the above structure, the reduced portion of the single crystal can be held stably by a clamping rod in a hollowed out groove mounted on the single crystal clamping device.

A fifteenth aspect of the method is a method of pulling up single crystals of the present invention, which comprises the steps:

preparing a single crystal pulling up apparatus having a single crystal clamping device fixed on a carriage capable of being raised or lowered for clamping the reduced portion of a single crystal and a wire-winding mechanism for winding up the pulling up wire when pulling up a seed crystal;

forming a reduced portion in the growth of a single crystal by sequentially forming a neck portion, an enlarged diameter portion and a reduced portion in the seed crystal by pulling up the seed crystal immersed in the melt of a raw material by means of a pulling up wire attached to a wire-winding mechanism;

adjusting the raising and lowering speed of the carriage, on which is provided a winding up mechanism for the crystal pulling up wire and the single crystal clamping device, and the winding up speed of the crystal pulling up wire, and taking hold of the single crystal after the single crystal clamping device is brought to relatively close to the reduced portion of the single crystal; and clamping the reduced portion of the single crystal with the single crystal clamping device and pulling up the single crystal with the top end thereof being held by the single crystal pulling up wire.

A sixteenth aspect of the method is a method of pulling up single crystals of the fifteenth aspect, wherein the clamping step includes lowering the single crystal clamping device to engage the single crystal with the winding up speed of the crystal pulling up wire being $V_{S/L}+\alpha$ and the descending speed of the carriage being $\alpha$; and when the single crystal clamping device is engaged to the single crystal, the winding up speed of the crystal pulling up wire being $V_{S/L}-\alpha$, and the raising speed of the carriage being $\alpha$ so as to maintain the pulling up speed of the single crystal at VS/L.

A seventeenth aspect of the method is a method of pulling up single crystals of the fifteenth aspect, wherein the pulling up step is mainly accomplished by raising the carriage, and monitoring the weight imposed on the neck portion and controlling the extent to which the crystal pulling up wire is wound up so as to insure the weight is less than that at which the neck portion breaks.

When using a crystal clamping device having the above structure, the clamping method of the single crystal of the invention is characterized by adjusting the raising and lowering speed of the carriage, which is furnished with the winding up mechanism for the crystal pulling up wire and the single crystal clamping device, and the winding up speed of the crystal pulling up wire, and after the single crystal clamping device is brought relatively close to the reduced portion of the single crystal, of taking hold of the single crystal.

Because the single crystal clamping device of the invention is integrated with the winding up mechanism for the crystal pulling up wire, as the single crystal clamping device is raised and lowered, the wire-winding mechanism also rises and descends.

According to the above method, both the speed at which the carriage is raised and lowered and the winding up speed of the crystal pulling up wire are adjusted as the body of the single crystal is grown, and therefore the reduced portion of the single crystal can be supported by the single crystal clamping device while maintaining the winding up speed of the crystal pulling up wire.

As to the method of adjusting the speed of the carriage and the crystal pulling up wire so as to maintain the pulling up speed of the single crystal at $V_{S/L}$, when lowering the single crystal clamping device to engage the single crystal, the winding up speed of the crystal pulling up wire is made to be $V_{S/L}+\alpha$, and the speed the carriage is lowered is made to be $\alpha$. When the single crystal clamping device is engaged to the single crystal, the winding up speed of the crystal pulling up wire is made to be $V_{S/L}-\alpha$, and the speed the carriage is raised is made to be $\alpha$.

By adjusting the speeds as indicated above, the single crystal clamping device is made to approach to the planned position of the single crystal while the pulling up speed of the single crystal is constantly maintained, whereupon the single crystal clamping device is engaged to the reduced portion of the single crystal and the single crystal clamping device is raised.

Furthermore, the clamping method of the single crystal of the invention is characterized in that when the single crystal is held by the single crystal clamping device, the pulling up of the single crystal is controlled by the raising of the carriage. At the same time, the extent to which the crystal pulling up wire is wound up is controlled by monitoring the weight imposed on the neck portion of the single crystal so as to insure the weight remains less than that at which the neck portion breaks.

According to the above structure, when the single crystal is being held by the single crystal clamping device, the single crystal clamping device and the winding up mechanism for the crystal pulling wire are raised simultaneously with the raising of the carriage. Therefore, the winding up of the crystal pulling up wire generally stops and only the carriage is raised to pull up the single crystal. Accordingly, by controlling the extent to which the crystal pulling up wire is wound up, breakage of the neck portion of the single crystal caused by the increase of its weight while being grown can be prevented.

BRIEF DESCRIPTION OF THE DRAWINGS

Next, the preferred embodiments of the single crystal pulling up apparatus and the single crystal pulling up method according to the invention are described with reference to the accompanying drawings in which.

DETAILED DESCRIPTION OF THE PREFERRED EMBODIMENT

Figure 1:
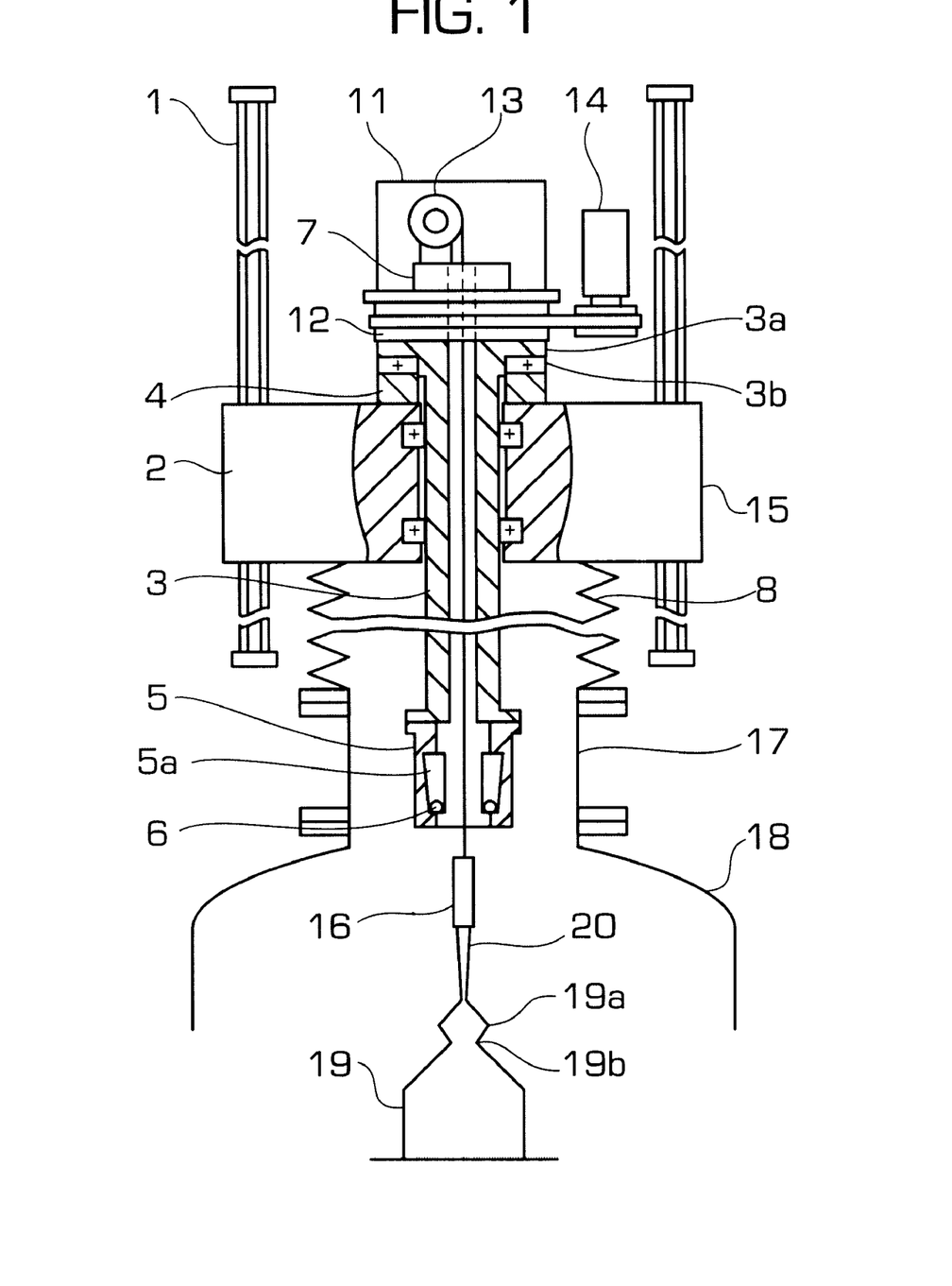
FIG. 1 is a schematic sectional view showing the brief construction of a single crystal clamping device.

FIG. 1 is a schematic sectional view of the rough structure of the single crystal pulling up apparatus. At the top of the single crystal fabricating apparatus by the CZ method, a carriage 2 which is raised and lowered by means of a ball screw along a guide shaft 1, is mounted. At the center of the carriage 2, a shaft 3 is rotatably mounted. A flange 3(a) mounted at the top end of the shaft 3 is disposed at the bottom surface of the pulley 12 of the winding up mechanism 11 for the single crystal pulling up wire. At the top surface of the carriage 2, a load cell 4 for measuring the combined load of the load imposed on the single crystal pulling up wire of the single crystal fabricating apparatus and the load imposed on the single crystal clamping device, is mounted. The total load-detecting load cell 4 is received on the flange 3a through a thrust bearing 3b. Furthermore, at the bottom end of the shaft 3, a single crystal clamping device 5 is mounted. The single crystal clamping device 5 is a cylinder in which a hollowed out groove 5a is provided. Two clamping rods 6,6 capable of moving vertically are received in the hollowed out groove 5a. The detailed structure of the single crystal clamping device 5 is described hereinafter.

The crystal pulling up wire winding up mechanism 11 is furnished with a wire-winding drum 13 mounted on the load cell 7 for the pulling up wire and a motor (not shown). The crystal pulling up wire-winding mechanism 11, the shaft 3 and the single crystal clamping device are rotated together by the single crystal rotating motor 14. The crystal pulling up wire 15 wound round on the wire-winding drum 13 passes through the hole formed at the center of the shaft 3 and the single crystal clamping device 5 and hangs down. At the bottom end of the crystal pulling wire 15, a seed holder 16 mounted on the seed crystal is suspended.

The detecting signals of the load cell 7 for the pulling up wire and the load cell 4 for the total load are transmitted to a controlling device (not shown) mounted outside of the single crystal fabricating apparatus. Based on these signals, the controlling device outputs instruction signals to rotate the wire-winding drum 13 and the guide shaft 1 in the clockwise or counterclockwise direction.

A stretchable bellow 8 is connected between the bottom surface of the carriage 2 and the top surface of the gate chamber 17. At the bottom surface of the gate chamber 17, a top chamber 18 and a main chamber (not shown) are connected therewith. Furthermore, the single crystal 19 is pulled up from the melt in the quartz crucible disposed in the main chamber after forming a neck portion 20, then an enlarged diameter portion 19a, then a reduced portion 19b having a smaller diameter than the enlarged diameter portion 19a, and growing to a predetermined diameter.

Figure 2:
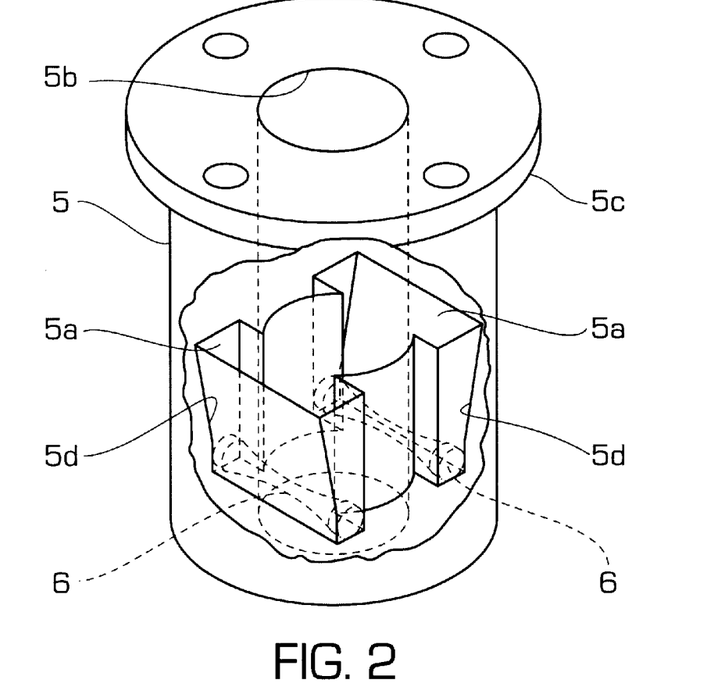
FIG. 2 is a perspective view showing the shape of the hollowed out groove disposed inside the single crystal clamping device.
Figure 3:
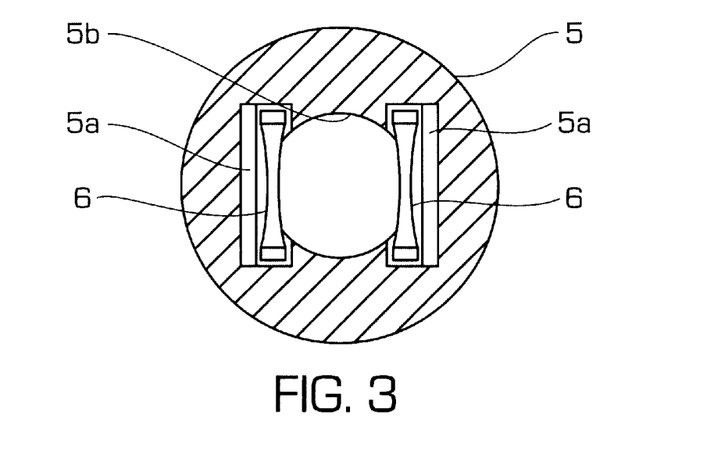
FIG. 3 is a top view showing the hollowed out groove.

FIG. 2 is a perspective view showing the shape of the hollowed out groove formed in the single crystal clamping device. FIG. 3 is the top view of the hollowed out groove. The single crystal clamping device 5 has a through hole 5b formed at the center thereof, through which the crystal pulling up wire 15 passes. A flange 5c for connecting to the shaft 3 as shown in FIG. 1 is provided at the top end of the single crystal clamping device 5. The diameter of the hole 5b is of a size that the enlarged diameter of the single crystal can easily pass. At the two sides of the hole 5b, wedge-shaped hollowed out grooves 5a, 5a having a wide upper portion and a narrow lower portion are oppositely formed. The bottom surface of the hollowed out groove 5a is higher than the bottom surface of the single crystal clamping device 5. At the bottom surface of the single crystal clamping device 5, the hole 5b is the only opening. Furthermore, in the hollowed out groove 5a, two clamping rods 6,6 in a drum shape having two bigger ends and a thin center portion are received. The clamping device 5 and the clamping rods 6,6 are made of high melting point metals such as molybdenum or carbon fiber reinforced carbons.

The single crystal pulling up method using the single crystal pulling up device of the invention is hereinafter described with reference to FIG. 1 and FIGS. 4–10. After the enlarged diameter portion and the reduced portion of single crystals have been formed, during the period in which the single crystal weight is achieving its predetermined weight, the single crystal clamping device 5 is ready above the growing single crystal 19 as shown in FIG. 1. At this time, the clamping rods 6,6 are at rest at the bottom of the hollowed out groove 5a. Furthermore, the weight of the single crystal 19 is monitored by the controlling device based on the signals detected by the load cell 7 for the pulling up wire. Furthermore, the growing speed of the single crystal 19, i.e., the winding up speed of the crystal pulling up wire 15, is maintained at $V_{S/L}$.

Figure 4:
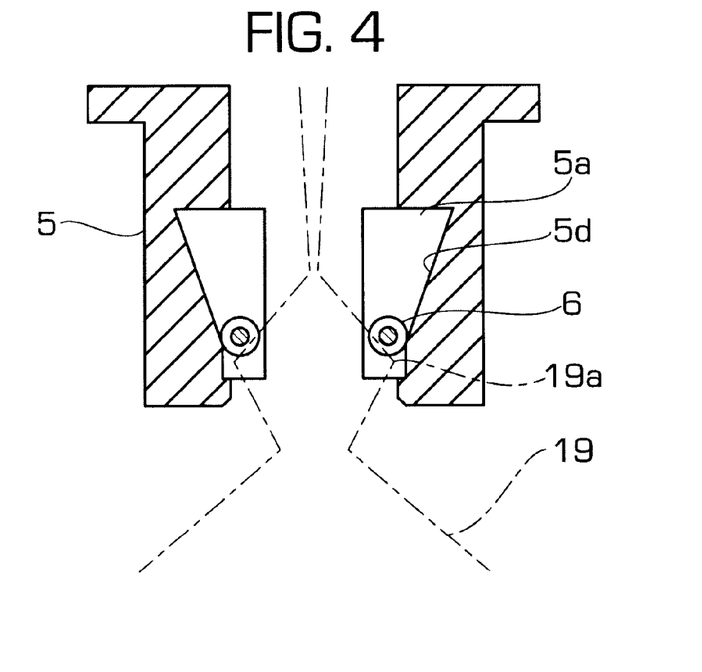
FIG. 4 is a schematic view showing the state in which the single crystal clamping device is lowered and the clamping rods are in contact with the single crystal.
Figure 5:
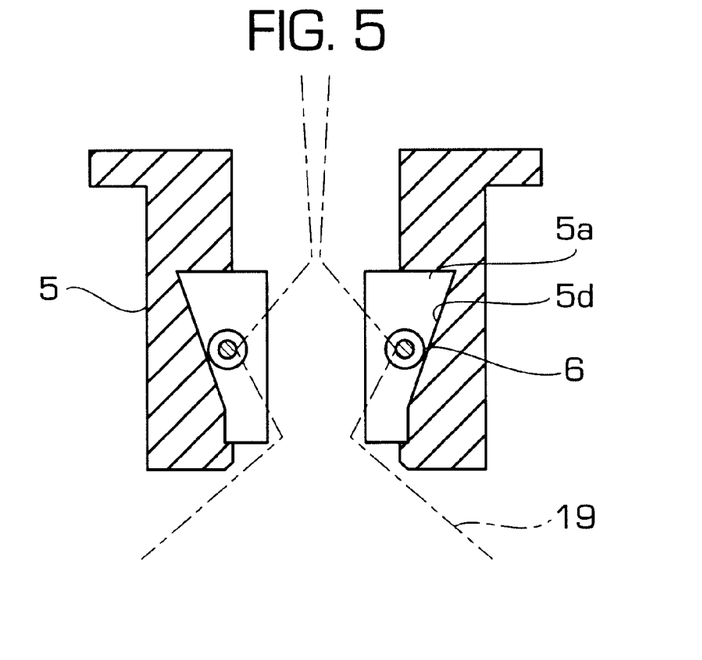
FIG. 5 is a schematic view showing the state in which the clamping rods are passing through the clearance between the single crystal and the hollowed out groove.

When the weight of the single crystal 19 reaches a predetermined value, the carriage 2 is lowered at a speed α based on the instruction signals of the controlling device. Because the wire-winding mechanism 11 for the crystal pulling up wire is also lowered with the carriage 2, the winding up speed of the crystal pulling up wire 15 is accelerated to $V_{S/L}+\alpha$, thereby maintaining the growing speed of the single crystal 19 VS/L. The single crystal clamping device 5 also descends together with the carriage 2, and thus as shown in FIG. 4, the clamping rods 6,6 are in contact with the conical surface at the upper side of the enlarged diameter portion 19a of the single crystal 19. The clamping rods 6,6 are then pushed outwardly and upwardly by the conical surface and are raised along the inclined surface 5d of the hollowed out groove 5a.

Figure 6:
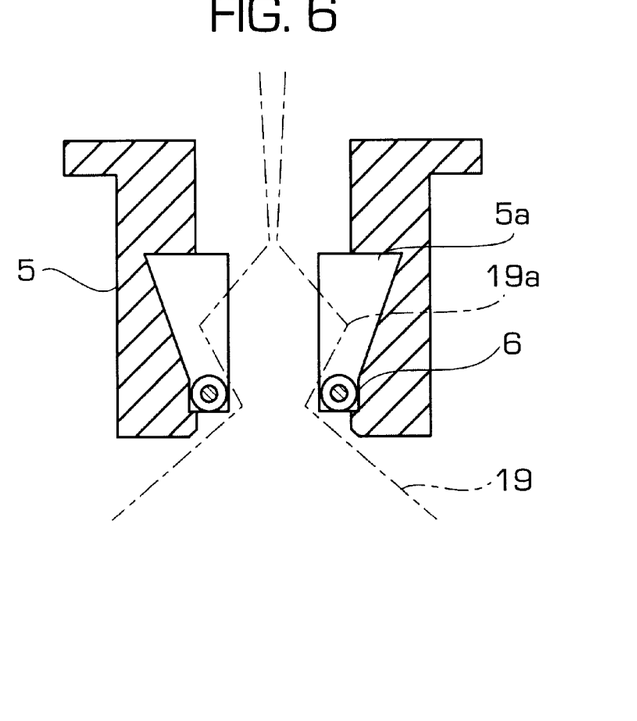
FIG. 6 is a schematic view showing the state in which the clamping rod has been dropped to the bottom of the hollowed out groove.

As the single crystal clamping device 5 continues to descend, the clearance between the periphery of the enlarged diameter portion 19a and the inclined surface 5d of the hollowed out groove 5a is increased. When the clearance becomes bigger than the diameter in the vicinity of the central portion of the clamping rod 6, the clamping rods 6,6 which have been pushed against the concial surface and raised in the hollowed out groove 5a, pass through the clearance and drop to the bottom portion of the hollowed out groove 5 as shown in FIG. 6.

Figure 7:
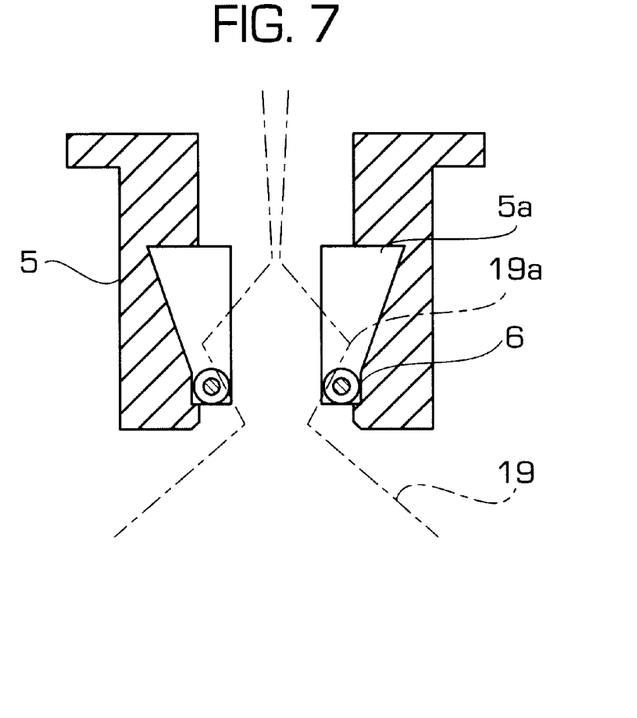
FIG. 7 is a schematic view showing the state in which the single crystal clamping device is being raised and the single crystal is being held.

Thereafter, the descent of the carriage stops in accordance with the instruction signals of the controlling device, and then the carriage is raised in accordance to the instruction signals of the controlling device. At this time, if the ascending speed of the carriage is α, then the winding up speed of the crystal pulling up wire is decelerated to $V_{S/L}-\alpha$. When the single crystal clamping device 5 is raised together with the carriage, as shown in FIG. 7, the clamping rods 6,6 which are in contact with the concial surface at the lower side of the enlarged diameter portion 19a of the single crystal 19, are pushed outwardly and downwardly against the concial surface and pressed against the bottom of the hollowed out groove 5a. Being in this state, the clamping of the single crystal 19 by the single crystal clamping device 5 is completed. As described above, the process of taking hold of the single crystal by the single crystal clamping device requires that the single crystal clamping device and the carriage be raised and lowered. However, the winding speed of the crystal pulling up wire is controlled in response to this, and therefore regardless of whether the carriage is being raised or lowered, the pulling up speed of the single crystal can be maintained at the same speed as when the carriage is stopped.

After the reduced portion of the single crystal is held by the single crystal clamping device, the weight $W_c$ of the single crystal is distributed between the crystal pulling up wire and the single crystal clamping device. When the load weight of the crystal pulling up wire is $W_w$ and the load weight of the single crystal clamping device is $W_{sup}$, then $W_c=W_w+W_{sup}$, and $W_c$ is used in the control of the growth of the crystal.

Figures 8, 9:
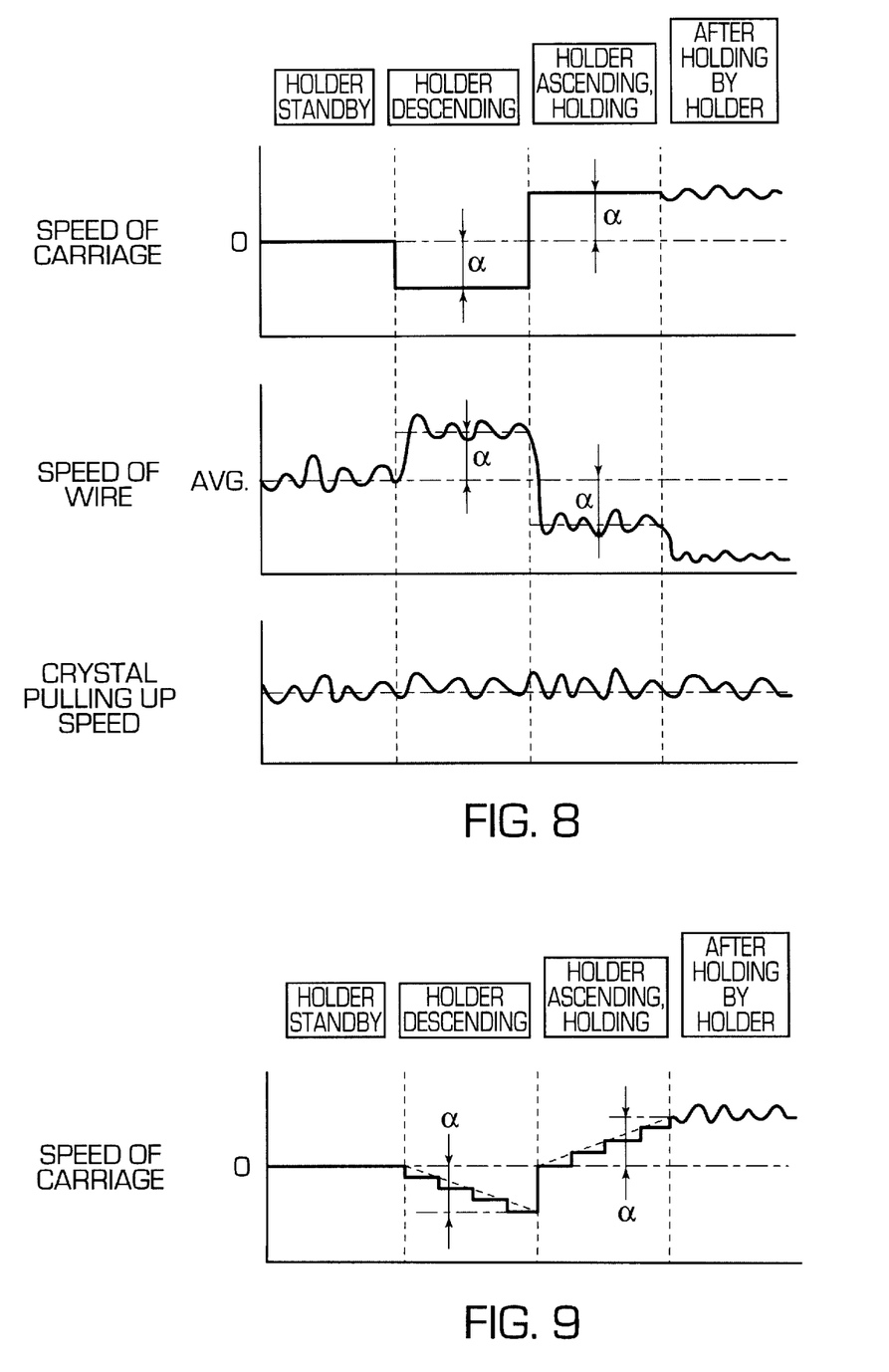
FIG. 8 is a graph showing the speed of the carriage, the speed of the crystal pulling up wire and the actual pulling up speed of the single crystal as the single crystal clamping device is standing by, lowered, raised as the single crystal is being taken hold of, and raised after the single crystal is held.
FIG. 9 is a graph showing a method of altering the speed of the carriage different from that in FIG. 8 as it is being raised and lowered.

FIG. 8 is a graph showing the speed of the carriage, the speed of the crystal pulling up wire and the actual pulling up speed of the single crystal when the single crystal clamping device is standing by, lowered, raised as the single crystal is being taken hold of, and raised after the single crystal is held. When the single crystal clamping device is standing by, the speed of the carriage is 0. In order to take hold of the single crystal, the clamping device is lowered and then raised, both at the speed of a but in opposite direction. Because the speed of the crystal pulling up wire is increased or decreased by a speed a corresponding to the speed at which the carriage is raised or lowered, however, the single crystal pulling up speed is substantially-maintained at a fixed value.

When clamping the single crystal with the single crystal clamping device and distributing the single crystal weight between the crystal pulling up wire and the single crystal clamping device, the rotation of the wire-winding drum generally stops. Thereafter, the carriage, which is furnished with the crystal pulling up wire-winding mechanism and the single crystal clamping device, is continuously raised, and the growth of the single crystal is continued. Because the winding up mechanism for the crystal pulling up wire is raised together with the carriage, looseness of the crystal pulling up wire does not occur. However, as the load applied on the neck portion is increased in proportion to the growth of the single crystal, it is necessary to control the load within a predetermined range to prevent the breakage of the neck portion. Accordingly, as shown in FIG. 8, even after the single crystal is held, winding up or unwinding of the crystal pulling up wire is performed to adjust the load applied to the neck portion. The adjustment of the load is performed in accordance with the instruction signals generated by the controlling device based on the measuring value of the load cell. However, the weight of the single crystal is supported primarily by the single crystal clamping device.

When the carriage is lowered or raised, it is also desirable to accelerate the speed from 0 to a step by step, as indicated by the solid line in FIG. 9, or to accelerate the speed from 0 to α in a straight line form as indicated by the dotted line. In these cases, the speed of the crystal pulling up wire corresponds to the variation of the speed of the carriage.

Figure 10:
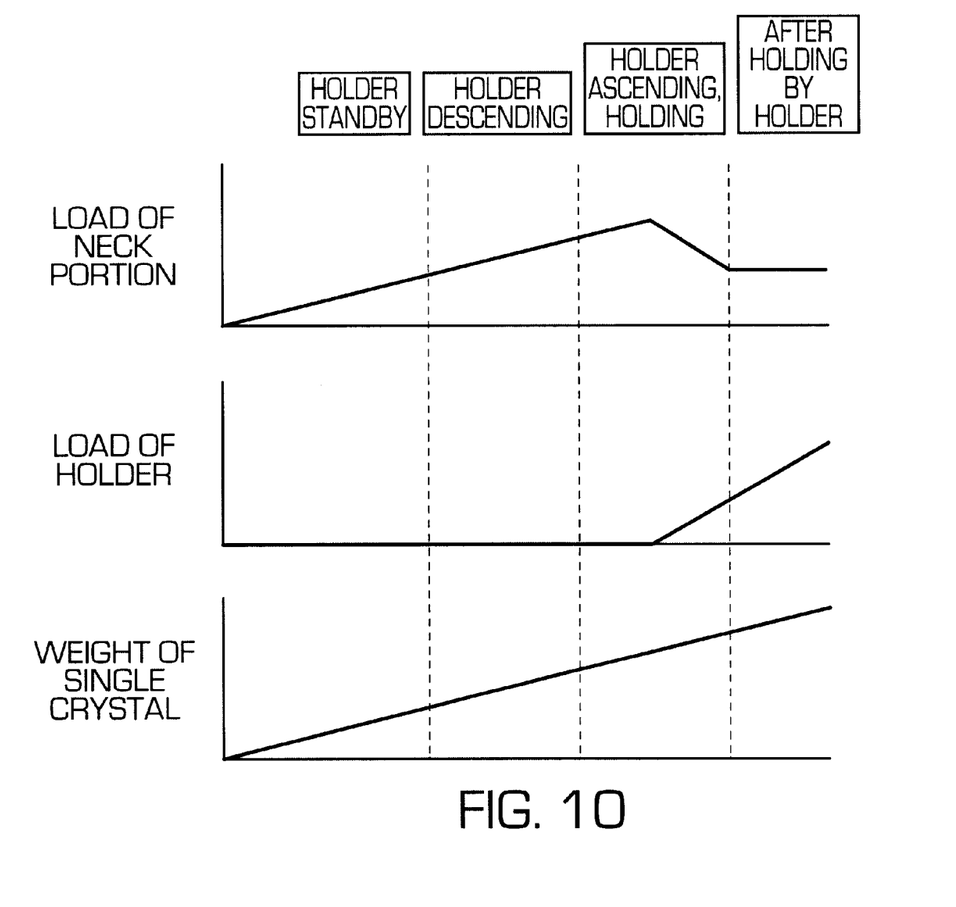
FIG. 10 is a graph showing the load of the neck portion of the single crystal, the load of the single crystal clamping device and the change of the weight of the single crystal at each step shown in FIG. 8.

FIG. 10 is a graph showing the load of the neck portion, the load of the single crystal clamping device and the change of the weight of the single crystal at each step shown in FIG. 8. With the growing of the single crystal, the weight of the single crystal increases gradually; therefore, the load applied on the neck portion increases gradually during the period the single crystal is being clamped of by the single crystal clamping device, and after being clamped decreases partially and then maintains at a predetermined value. The load of the single crystal clamping device increases gradually immediately after the single crystal is clamped.

In this embodiment, the description is made of a single crystal clamping device and a clamping method for the reduced portion formed between the neck portion and the shoulder portion of the single crystal. However, the invention is also suitable for use in clamping the reduced portion formed near the top end of the body portion of the single crystal. Furthermore, it is also possible to use a rod without a reduced central segment.

Further the pulling up wire-load cell and the summation load cell can be also applicable for controlling a diameter of the single crystal being pulled up. Namely the diameter of the single crystal being pulled up is adjusted by controlling the winding up speed of the wire-winding mechanism and the ascending/descending speed of the pulling up mechanism, while monitoring the pulling up wire-load cell and the summation load cell and calculating a weight of the single crystal being pulled up.

As stated above, according to the invention, the following effects can be obtained.

(1) As the single crystal clamping device is fixed on the winding up mechanism for the crystal pulling up wire, it can be used as a high precision single crystal clamping device for clamping a single crystal.

(2) The single crystal clamping device is a rigid structure and is not a suspension structure, and thus no vibration or inclination of the single crystal clamping device occurs. Accordingly, there is no possibility of dislocation when the single crystal is taken hold of or while it is being held.

(3) Since the load applied on the neck portion and the load applied on the single crystal clamping device are adjusted based on the measured value of load cells and the load applied on the neck portion is controlled within an allowable range, the breakage of the neck portion can be prevented. Furthermore, as the load of the neck portion can be set at any value in the allowable range by setting the load distribution between the two (taking into consideration the allowable load of the single crystal clamping device), it is possible to increase the maximum weight of a single crystal pulled up.

(4) As the shaft center of the clamping device and the shaft center of the crystal pulling up wire are made to be mechanically congruous to each other, and the crystal pulling up wire is rotated together with the single crystal clamping device, their rotating speeds can be made absolutely consistent with each other. Accordingly, when the single crystal is held by the single crystal clamping device, friction between the single crystal and the single crystal clamping device caused by the slight difference in their rotating speeds is not generated, and thus a smooth and safe clamping can be obtained.

(5) In the single crystal pulling up which uses both the crystal pulling up wire and the single crystal clamping device, it is equally possible to pull up the single crystal and at the same time control the growing speed of the single crystal at a desired value as in case of a the single crystal pulling up using only the crystal pulling wire. Therefore, the invention is suitable for use in a conventional high precision crystal growing technique.

(6) Since the clamping rods in contact with the reduced portion of the single crystal are drum-shaped, and two points of each are in contact with the reduced portion of the single crystal, the stress generated at the points of contact is reduced and the generation of chips and cracks in the single crystal can be avoided.

(7) Having the above effects, it is possible to efficiently manufacture a heavy weight single crystal.

What is claimed is:

1. An apparatus for pulling up single crystals comprising:
   a single crystal pulling up wire for pulling up a seed crystal immersed in a melt of a raw material;
   a single crystal clamping device for clamping one end of the single crystal grown beneath the seed crystal, which is fixed at the bottom end of a shaft, having a hole;
   a pulling up wire-winding mechanism winding up the single crystal pulling up wire; and
   a pulling up wire-load cell for detecting the load applied on the crystal;
   wherein the shaft, the pulling up wire-winding mechanism, and the single crystal clamping device are carried by a carriage ascending/descending along a guide shaft, and are rotated together.

2. The apparatus for pulling up single crystals as claimed in claim 1, further comprising:
   a controlling device for controlling the winding up speed of the wire-winding mechanism and the ascending/ descending speed of the pulling up mechanism, so as to adjust a ratio between the load applied on the crystal pulling up wire and the load applied on the single crystal clamping device so as not to break the single crystal, by monitoring the pulling up wire-load cell and a summation load cell.

3. The apparatus for pulling up single crystals as claimed in claim 1, wherein said single crystal clamping device comprises:

a body having a hole at the center thereof;

a plurality of hollowed out grooves formed at the periphery of the hole; and vertically movable clamping rods disposed in said plurality of grooves for clamping the reduced portion formed in the top end of the single crystal being pulled up.

4. The apparatus for pulling up single crystals as claimed in claim 3, wherein said clamping rod is in a shape of a drum whose two end portions are larger than center portion and the center portion is constricted.

5. The apparatus for pulling up single crystals as claimed in claim 3, wherein said single crystal clamping device is made of refractory metal.

6. The apparatus for pulling up single crystal as claimed in claim 5, wherein said single crystal clamping device is made of molybdenum.

7. The apparatus for pulling up single crystals as claimed in claim 3, wherein said single crystal clamping device is made of carbon fiber reinforced carbon.

8. The apparatus for pulling up single crystals as claimed in claim 1, further comprising:

a diameter controlling device for controlling the winding up speed of the wire-winding mechanism and the ascending/descending speed of the pulling up mechanism, so as to control a diameter of the single crystal being pulled up by monitoring the pulling up wire-load cell and a summation load cell and calculating a weight of the single crystal being pulled up.

9. A single crystal clamping device comprising:

a body having a hole at the center thereof;

a plurality of hollowed out grooves formed at the periphery of the hole; and vertically movable clamping rods disposed in said plurality of grooves for clamping the reduced portion formed in the top end of the single crystal being pulled up.

10. The single crystal clamping device as claimed in claim 9, wherein said clamping rod is in a shape of a drum whose two end portions are larger than center portion and the center portion is constricted.

11. The single crystal clamping device as claimed in claim 10, wherein said single crystal clamping device is made of refractory metal.

12. The single crystal clamping device as claimed in claim 11, wherein said single crystal clamping device is made of molybdenum.

13. The single crystal clamping device as claimed in claim 10, wherein said single crystal clamping device is made of carbon fiber reinforced carbon.

* * * * *